(12) United States Patent
Tsai

(10) Patent No.: US 10,068,924 B2
(45) Date of Patent: Sep. 4, 2018

(54) DISPLAY PANEL AND DISPLAY APPARATUS

(71) Applicant: InnoLux Corporation, Miao-Li County (TW)

(72) Inventor: Chia-Hao Tsai, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 356 days.

(21) Appl. No.: 14/288,540

(22) Filed: May 28, 2014

(65) Prior Publication Data

US 2014/0354933 A1    Dec. 4, 2014

(30) Foreign Application Priority Data

Jun. 4, 2013 (TW) .............. 102119711 A

(51) Int. Cl.
| | |
|---|---|
| *G02F 1/136* | (2006.01) |
| *H01L 27/12* | (2006.01) |
| *G02F 1/1343* | (2006.01) |
| *G02F 1/1362* | (2006.01) |
| *G02F 1/1368* | (2006.01) |
| *H01L 27/32* | (2006.01) |
| *H01L 29/786* | (2006.01) |

(52) U.S. Cl.
CPC ........ *H01L 27/1225* (2013.01); *G02F 1/1343* (2013.01); *G02F 1/1368* (2013.01); *G02F 1/136227* (2013.01); *H01L 27/124* (2013.01); *H01L 27/3248* (2013.01); *H01L 27/3262* (2013.01); *G02F 2001/134372* (2013.01); *H01L 27/1222* (2013.01); *H01L 27/1251* (2013.01); *H01L 29/7869* (2013.01)

(58) Field of Classification Search
None
See application file for complete search history.

(56) References Cited

U.S. PATENT DOCUMENTS

| 8,603,843 B2 | 12/2013 | Song et al. |
|---|---|---|
| 2005/1039836 | 6/2005 | Oh |

(Continued)

FOREIGN PATENT DOCUMENTS

| CN | 102148196 | 8/2011 |
|---|---|---|
| CN | 103824862 | 5/2014 |

(Continued)

*Primary Examiner* — Jessica M Merlin
*Assistant Examiner* — Mark Teets
(74) *Attorney, Agent, or Firm* — McClure, Qualey & Rodack, LLP

(57) ABSTRACT

An embodiment of the present invention provides a display panel including a first substrate; a device layer disposed on the first substrate, wherein the device layer includes a plurality of thin-film transistors and the thin-film transistor includes a gate electrode; a gate insulating layer disposed on the first substrate and covering the gate electrode; a source electrode disposed on the gate insulating layer; a transparent conductive layer disposed on the gate insulating layer and overlapping and electrically connecting the source electrode; a pixel electrode; an active layer electrically connecting the transparent conductive layer and the pixel electrode; a second substrate disposed on the first substrate; and a display medium between the first substrate and the second substrate.

13 Claims, 12 Drawing Sheets

(56) References Cited

U.S. PATENT DOCUMENTS

| | | | | |
|---|---|---|---|---|
| 2010/0012939 A1* | 1/2010 | Ishii | ................. | G02F 1/136213 |
| | | | | 257/59 |
| 2010/0065840 A1* | 3/2010 | Yamazaki | ............. | G02F 1/1368 |
| | | | | 257/43 |
| 2010/0155733 A1* | 6/2010 | Moon | ............... | G02F 1/136227 |
| | | | | 257/59 |
| 2010/0301325 A1* | 12/2010 | Bae | ..................... | H01L 27/1225 |
| | | | | 257/43 |
| 2011/0063556 A1* | 3/2011 | Ahn | ................. | G02F 1/134363 |
| | | | | 349/139 |
| 2013/0088660 A1* | 4/2013 | Kaneko | ................ | G02F 1/1362 |
| | | | | 349/43 |

FOREIGN PATENT DOCUMENTS

| | | | | |
|---|---|---|---|---|
| EP | 0 372 356 | 6/1990 | | |
| JP | WO 2011158424 A1 * | 12/2011 | .......... | G02F 1/1362 |

* cited by examiner

DISPLAY PANEL AND DISPLAY APPARATUS

CROSS REFERENCE TO RELATED APPLICATIONS

This Application claims priority of Taiwan Patent Application No. 102119711, filed on Jun. 4, 2013, the entirety of which is incorporated by reference herein.

BACKGROUND OF THE INVENTION

Field of the Invention

The present invention relates to thin-film transistors, and in particular relates to a display panel with thin-film transistors and a display apparatus with thin-film transistors.

Description of the Related Art

With the progress of display technology, human life is getting more convenient with the assistance of display devices. With demands of being light and thin, flat panel displays (FPD) have now become the most popular type of displays. Among the variety of FPDs, liquid crystal displays (LCDs) are highly praised by consumers because of advantages such as efficient space utilization, low power consumption, no radiation, and low electromagnetic interference (EMI).

Liquid crystal displays are mainly composed of an active array substrate, a color filter substrate, and a liquid crystal layer located therebetween. The active array substrate has an active region and a peripheral circuit region. The active arrays are located in the active region, and the driving circuits having a plurality of bottom gate thin-film transistors are located in the periphery circuit region.

In the related art, the manufacturing process of the bottom gate thin-film transistor easily suffers from some problems. For example, the forming of a source electrode and a drain electrode may easily damage an active layer therebelow, which results in back channel damage. To solve the problem, a conventional technology forms an etch stop layer on an active layer and forms a source electrode and a drain electrode on the etch stop layer. The source electrode and the drain electrode pass through the etch stop layer to electrically connect to the active layer.

However, compared to thin-film transistors without etch stop layers, thin-film transistors with etch stop layers have problems such as larger device sizes and longer channel lengths. Therefore, the thin-film transistors with the etch stop layers are not suitable to be applied in display panels with high resolution, high aperture ratios, and narrow borders.

BRIEF SUMMARY OF THE INVENTION

An embodiment of the invention provides a display panel which includes: a first substrate; a device layer disposed on the first substrate, wherein the device layer includes a plurality of thin-film transistors and the thin-film transistor comprises: a gate electrode; a gate insulating layer disposed on the first substrate and covering the gate electrode; a source electrode disposed on the gate insulating layer; a transparent conductive layer disposed on the gate insulating layer and overlapping and electrically connecting the source electrode; a pixel electrode disposed on the gate insulating layer; an active layer disposed on the gate insulating layer and over the gate electrode, wherein the active layer is electrically connected to the transparent conductive layer and the pixel electrode; a second substrate disposed on the first substrate, wherein the device layer is located between the first substrate and the second substrate; and a display medium located between the first substrate and the second substrate.

An embodiment of the invention provides a display apparatus, which includes: a display panel described above; and a back light module, wherein the display panel is disposed on the back light module.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," and (like descriptions) a second layer include embodiments where the first and second layers are in direct contact and those where one or more layers are interposing the first and second layers.

Figure 1A:
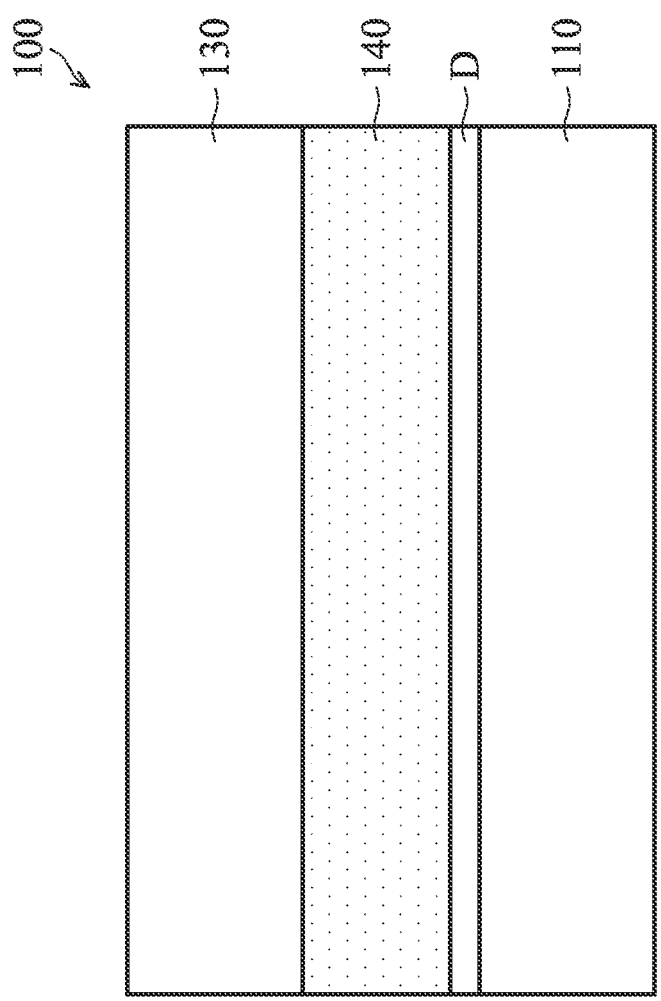
FIG. 1A is a cross-sectional view of a display panel according to an embodiment of the present invention.
Figure 1B:
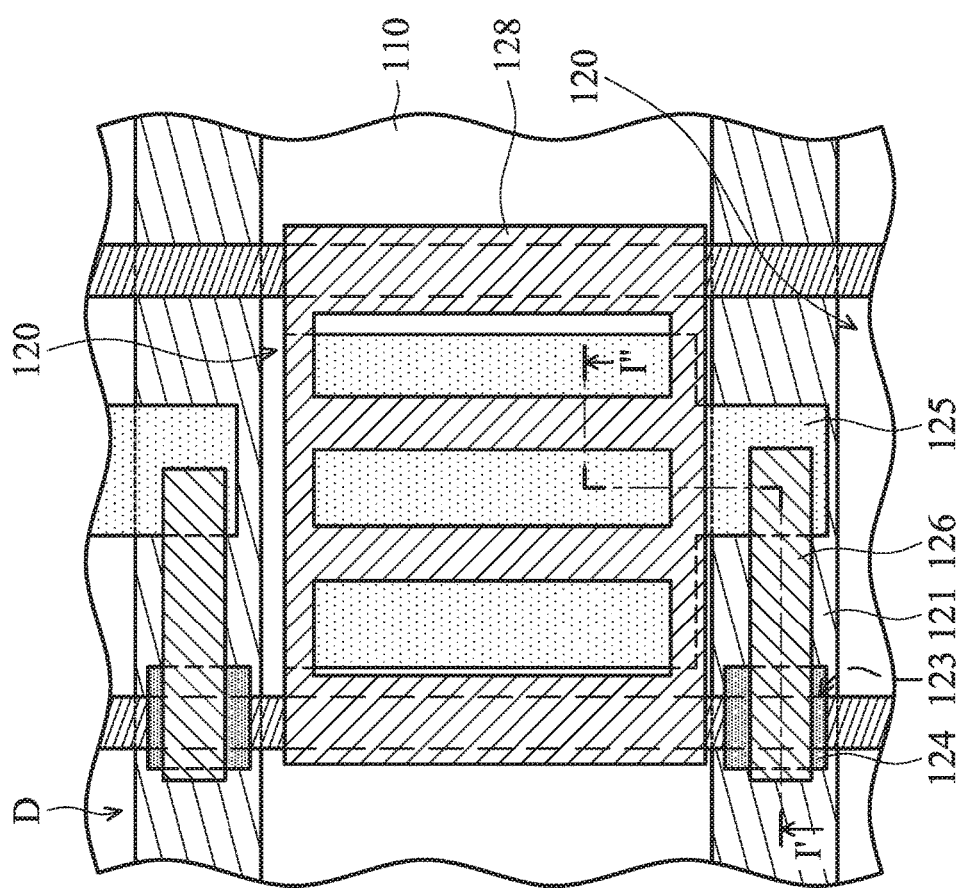
FIG. 1B is a top view of the device layer and the first substrate of FIG. 1A.
Figure 1C:
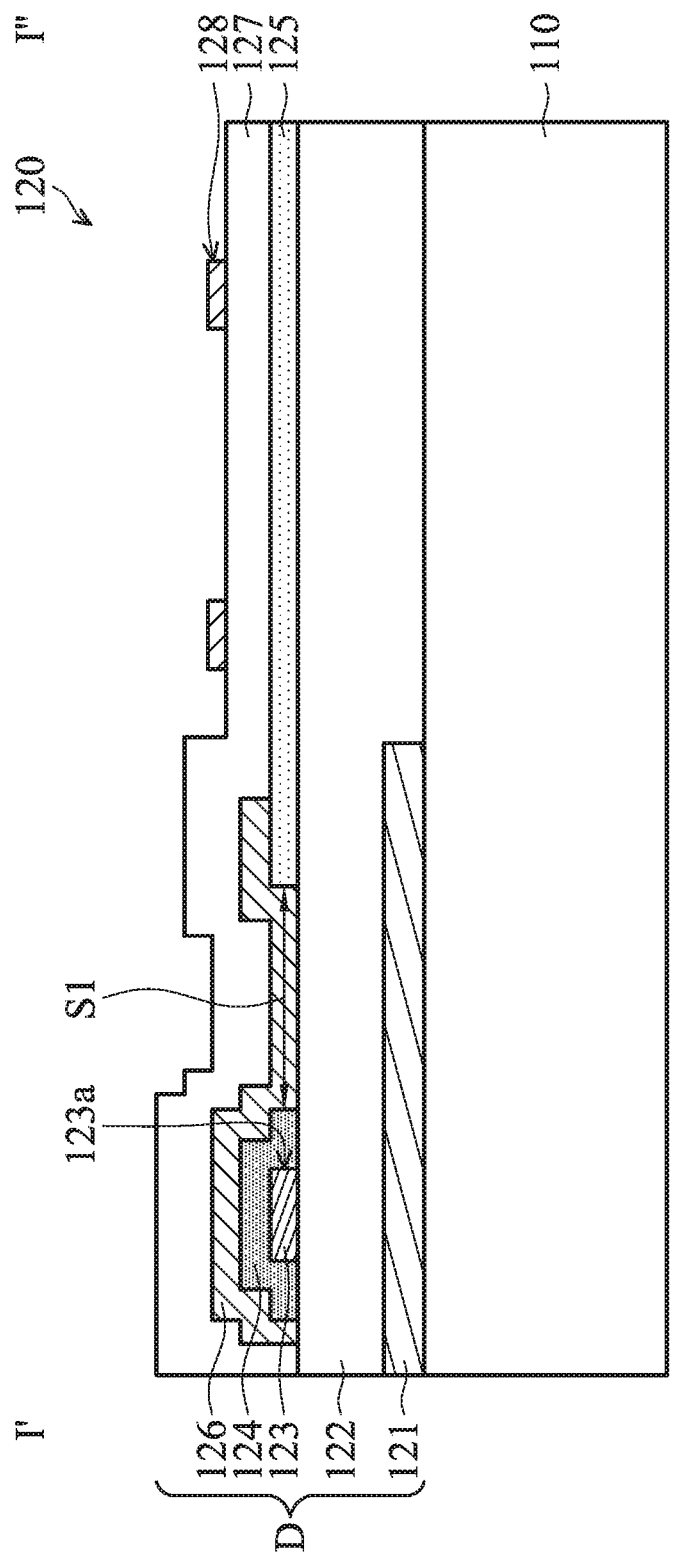
FIG. 1C is a cross-sectional view of the device layer and the first substrate taken along the line I'-I" of FIG. 1B.

FIG. 1A is a cross-sectional view of a display panel according to an embodiment of the present invention. FIG. 1B is a top view of the device layer and the first substrate of FIG. 1A. FIG. 1C is a cross-sectional view of the device layer and the first substrate taken along the line I'-I" of FIG. 1B.

Referring to FIG. 1A, a display panel 100 of the present embodiment includes a first substrate 110, a device layer D, a second substrate 130 and a display medium 140.

Specifically, the first substrate 110 and the second substrate 130 are, for example, transparent substrates (such as glass substrates or polymer substrates). A color filter layer (not shown) may be disposed on one of the first substrate 110 and the second substrate 130. The device layer D is disposed on the first substrate 110. The second substrate 130 is disposed on the first substrate 110, wherein the device layer D is located between the first substrate 110 and the second substrate 130. The display medium 140 is located between the first substrate 110 and the second substrate 130. The display medium 140 is, for example, a liquid crystal layer or an organic light-emitting layer.

Referring to FIGS. 1A, 1B and 1C, the device layer D includes a plurality of thin-film transistors 120. For simplicity and clarity, FIGS. 1B and 1C merely depict a portion of the device layer D, and only one of the transistors 120 is illustrated in detail, but does not limit the invention thereto. The thin-film transistor 120 includes a gate electrode 121, a gate insulating layer 122, a source electrode 123, a transparent conductive layer 124, a pixel electrode 125 and an active layer 126. For simplicity, FIG. 1B merely depicts the first substrate 110 and the conductive films including the gate electrode 121, the source electrode 123, the transparent conductive layer 124, the pixel electrode 125 and the active layer 126.

Specifically, the gate electrode (or the scan line) 121 is disposed on the first substrate 110. The gate electrode 121 may include aluminum (Al) and molybdenum (Mo), copper (Cu) or other suitable conductive materials. The gate insulating layer 122 is disposed on the first substrate 110 and covers the gate electrode 121. The gate insulating layer 122 includes organic materials or oxides, wherein the organic materials are, for example, Polytetrafluoroethylene (PFA), silica based materials, or acrylic based materials. The oxides include aluminum oxides, silicon oxides, titanium oxides, or silicon aluminum oxides. In one embodiment, the gate insulating layer 122 includes silicon nitrides.

The source electrode 123 is disposed on the gate insulating layer 122. The source electrode 123 is, for example, a Mo/Al/Mo triple-layer structure, or other suitable metal material layers. The transparent conductive layer 124 is disposed on the gate insulating layer 122 and overlaps the source electrode 123. The transparent conductive layer 124 is electrically connected to the source electrode 123.

In one embodiment, the transparent conductive layer 124 covers a portion of the source electrode 123. In the present embodiment, the transparent conductive layer 124 covers the whole source electrode 123. In the present embodiment, the transparent conductive layer 124 directly contacts a sidewall 123a of the source electrode 123. The transparent conductive layer 124 includes transparent metal oxides, such as indium tin oxide, or other transparent conductive materials with good conductivity.

It should be noted that when the source electrode 123 is a Mo/Al/Mo triple-layer structure, the aluminum layer tends to be formed with aluminum needles on sidewalls of the aluminum layer in previous etching processes (i.e., the etching process patterning the metal layer to form the source electrode), which tends to affect the electrical connection between the aluminum layer and the other devices. Since the transparent conductive layer 124 of the present embodiment is in direct contact with the sidewall 123a of the source electrode 123, when an annealing process is performed to the transparent conductive layer 124, the transparent conductive layer 124 may react with the aluminum layer to oxidize the aluminum needles into aluminum oxides. Therefore, the problem of the bad electrical connection between the source electrode 123 and the active layer 126 due to the aluminum needles may be solved by forming the transparent conductive layer 124.

The pixel electrode 125 is disposed on the gate insulating layer 122. In one embodiment, the transparent conductive layer 124 and the pixel electrode 125 are formed in the same thin film deposition process. The transparent conductive layer 124 and the pixel electrode 125 have the same material such as indium tin oxides. In one embodiment, the space S1 between the transparent conductive layer 124 and the pixel electrode 125 is less than or equal to 4 μm and larger than or equal to 0.5 μm.

The active layer 126 is disposed on the gate insulating layer 122 and above the gate 121, and the active layer 126 is electrically connected to the transparent conductive layer 124 and the pixel electrode 125. The active layer 126 includes, for example, metal oxides such as indium gallium zinc oxides or other materials suitable for the active layer. In one embodiment, the active layer 126 covers a portion of the transparent conductive layer 124. In the present embodiment, the active layer 126 covers the whole transparent conductive layer 124.

In one embodiment, the active layer 126 covers a portion of the transparent conductive layer 124 and a portion of the source electrode 123. In the present embodiment, the active layer 126 covers the whole transparent conductive layer 124 and the whole source electrode 123. In one embodiment, the active layer 126 covers a portion of the pixel electrode 125. In one embodiment, the pixel electrode 125 is in direct contact with the active layer 126.

It should be noted that the pixel electrode 125 of the present embodiment has the function of a drain electrode, and therefore the present embodiment does not need to perform a process for forming the drain electrode. Since the active layer 126 of the present embodiment is electrically connected to the source electrode 123 through the transparent conductive layer 124, the channel length of the thin-film transistor 120 of the present embodiment is equal to the space Si between the transparent conductive layer 124 (electrically connected to the source electrode 123) and the pixel electrode 125 (with the function of the drain electrode). Since the transparent conductive layer 124 and the pixel electrode 125 are formed in the same process, the space S1 only depends on the process limit value of the photolithography etching process. Therefore, the channel length (i.e., the space S1) of the thin-film transistor 120 of the present embodiment is shorter than the channel length of the conventional thin-film transistor with the etch stop layer.

In one embodiment, the thin-film transistor 120 optionally further includes an insulating layer 127 and a common electrode 128. The insulating layer 127 is disposed on the gate insulating layer 122 and covers the transparent conductive layer 124, the pixel electrode 125, the source electrode 123 and the active layer 126. The common electrode 128 is disposed on the insulating layer 127 and above the pixel electrode 125.

Display panels of various embodiments are illustrated below. The difference between the display panels illustrated below and the display panels of FIGS. 1A-1C is the structure of the device layer D. Therefore, for simplicity, the figures of the embodiments illustrated below are top views and cross-sectional views of the device layer D and the first substrate 110. Throughout the various views and illustrative embodiments, like reference numbers are used to designate like elements which have the same or like materials or structures. Therefore, the detailed descriptions are not repeated hereinafter.

Figure 2A:
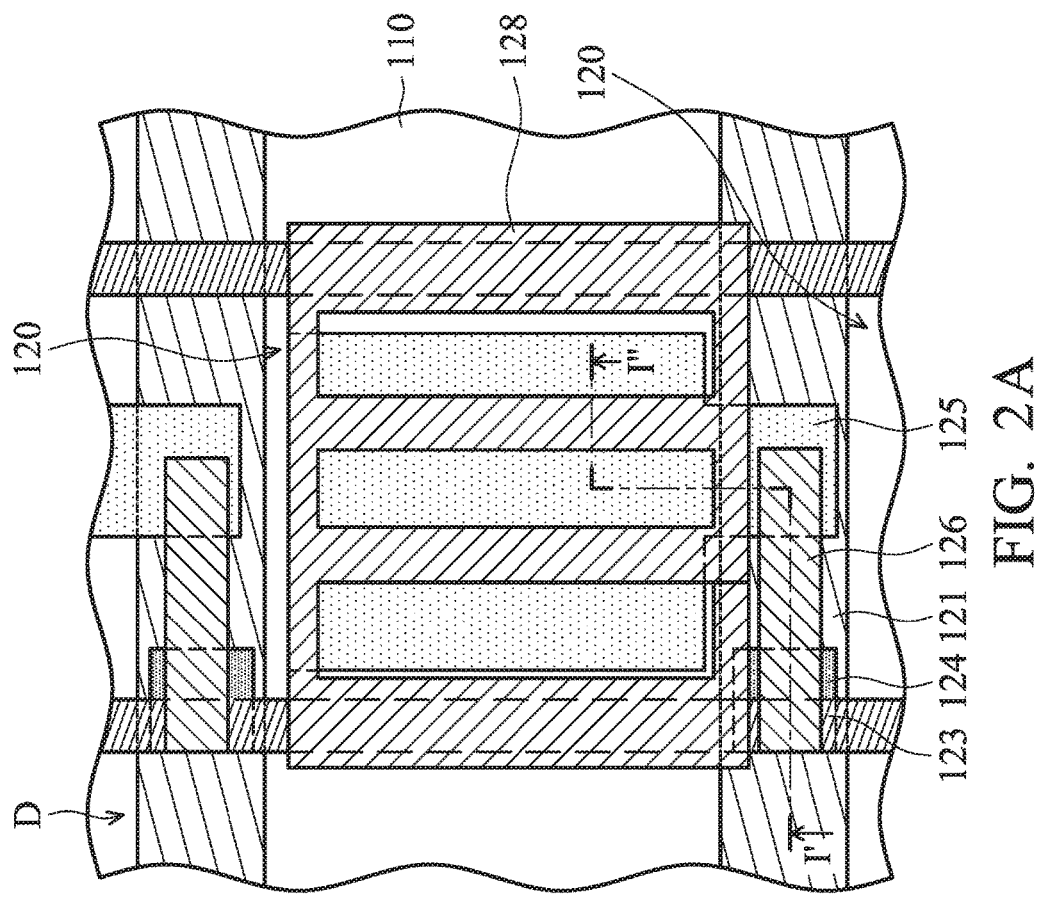
FIG. 2A is a top view of a device layer and a first substrate of a display panel in accordance with another embodiment of the present invention.
Figure 2B:
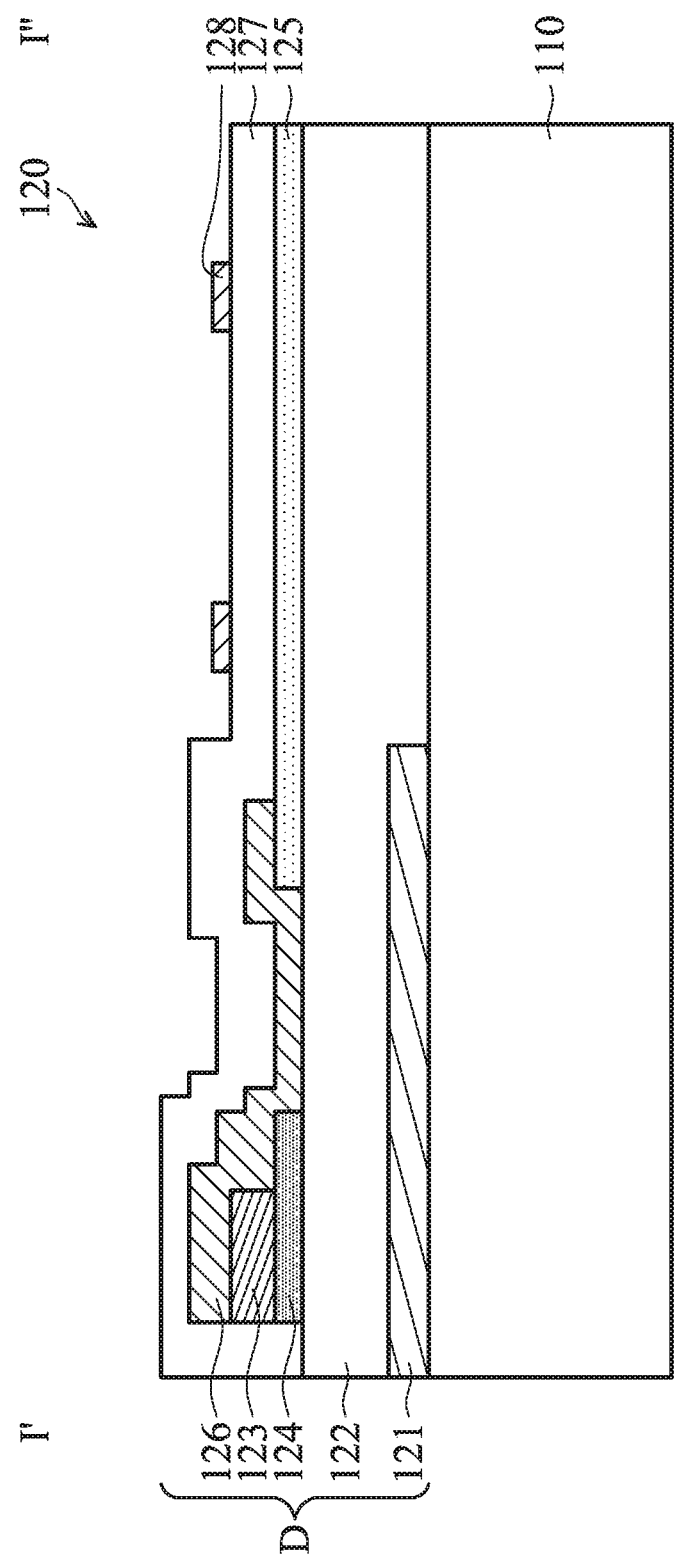
FIG. 2B is a cross-sectional view of the device layer and the first substrate taken along the line I'-I" of FIG. 2A.

FIG. 2A is a top view of a device layer and a first substrate of a display panel in accordance with another embodiment of the present invention. FIG. 2B is a cross-sectional view of the device layer and the first substrate taken along the line I'-I" of FIG. 2A.

Referring to FIGS. 2A and 2B, the device layer D of the present embodiment is similar to the device layer D of FIGS. 1A-1C. The difference therebetween is that the transparent conductive layer 124 of the thin-film transistor 120 of the device layer D of the present embodiment is located between the source electrode 123 and the gate insulating layer 122. In other words, the source electrode 123 of the present embodiment is located on the transparent conductive layer 124. In one embodiment, the active layer 126 only covers the transparent conductive layer 124 to electrically connect to the source electrode 123 through the transparent conductive layer 124. In the present embodiment, the active layer 126 simultaneously covers the source electrode 123 and the transparent conductive layer 124.

Figure 3A:
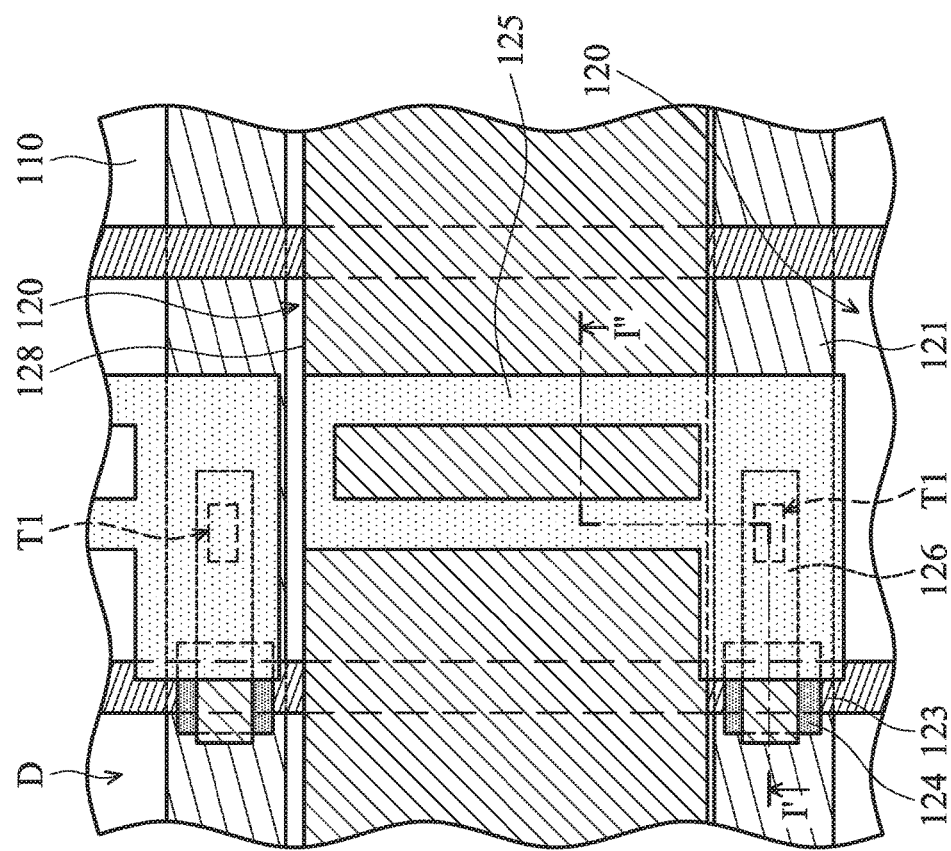
FIG. 3A is a top view of a device layer and a first substrate of a display panel in accordance with still another embodiment of the present invention.
Figure 3B:
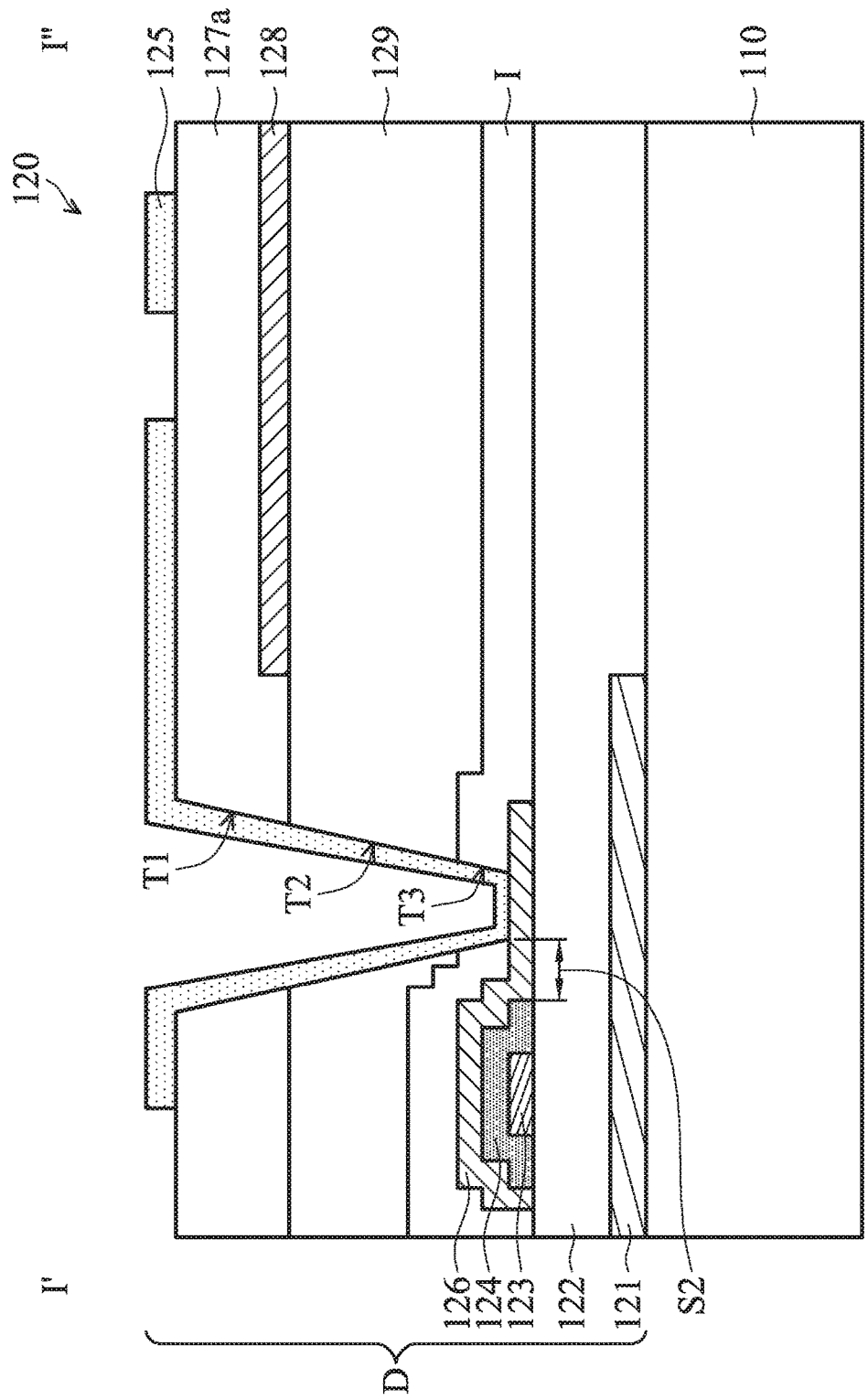
FIG. 3B is a cross-sectional view of the device layer and the first substrate taken along the line I'-I" of FIG. 3A.

FIG. 3A is a top view of a device layer and a first substrate of a display panel in accordance with still another embodiment of the present invention. FIG. 3B is a cross-sectional view of the device layer and the first substrate taken along the line I'-I" of FIG. 3A.

Referring to FIGS. 3A and 3B, the device layer D of the present embodiment is similar to the device layer D of FIGS. 1A-1C. The difference therebetween is that the pixel electrode 125 of the thin-film transistor 120 of the device layer D of the present embodiment is located on the active layer 126.

Specifically, in the present embodiment, the thin-film transistor 120 further includes a first insulating layer 127a. The first insulating layer 127a is disposed on the gate insulating layer 122 and covers the source electrode 123, the transparent conductive layer 124 and the active layer 126. The first insulating layer 127a has a first through hole T1 exposing the active layer 126, and the pixel electrode 125 is disposed on the first insulating layer 127a and extends into the first through hole T1 to connect the active layer 126.

Besides, the thin-film transistor 120 may optionally further include a second insulating layer 129 and a common electrode 128. The second insulating layer 129 is disposed between the gate insulating layer 122 and the first insulating layer 127a and covers the source electrode 123, the transparent conductive layer 124 and the active layer 126.

The second insulating layer 129 has a second through hole T2, and the second through hole T2 connects the first through hole T1 to expose the active layer 126. The pixel electrode 125 extends into the first through hole T1 and the second through hole T2 to connect to the active layer 126. The common electrode 128 is disposed on the second insulating layer 129. The common electrode 128 is located between the second insulating layer 129 and the first insulating layer 127a and under the pixel electrode 125.

It should be noted that, in the present embodiment, the pixel electrode 125 and the transparent conductive layer 124 are formed in different processes. Therefore, the space S2 between the pixel electrode 125 and the transparent conductive layer 124 is not limited to the process limit value of the photolithography etching process. Thereby, the space S2 may be smaller than the space S1 of FIGS. 1A-1C. In the present embodiment, the space S2 between the transparent conductive layer 124 and the pixel electrode 125 is less than or equal to 3 μm and larger than or equal to 0.5 μm.

In the present embodiment, the thin-film transistor 120 optionally further includes a third insulating layer I. The third insulating layer I is disposed between the gate insulating layer 122 and the second insulating layer 129 and covers the source electrode 123, the transparent conductive layer 124 and the active layer 126. The third insulating layer I has a third through hole T3. The third through hole T3 is connected to the first through hole T1 and the second through hole T2. The pixel electrode 125 extends into the first through hole T1, the second through hole T2 and the third through hole T3 to connect the active layer 126.

Figure 4:
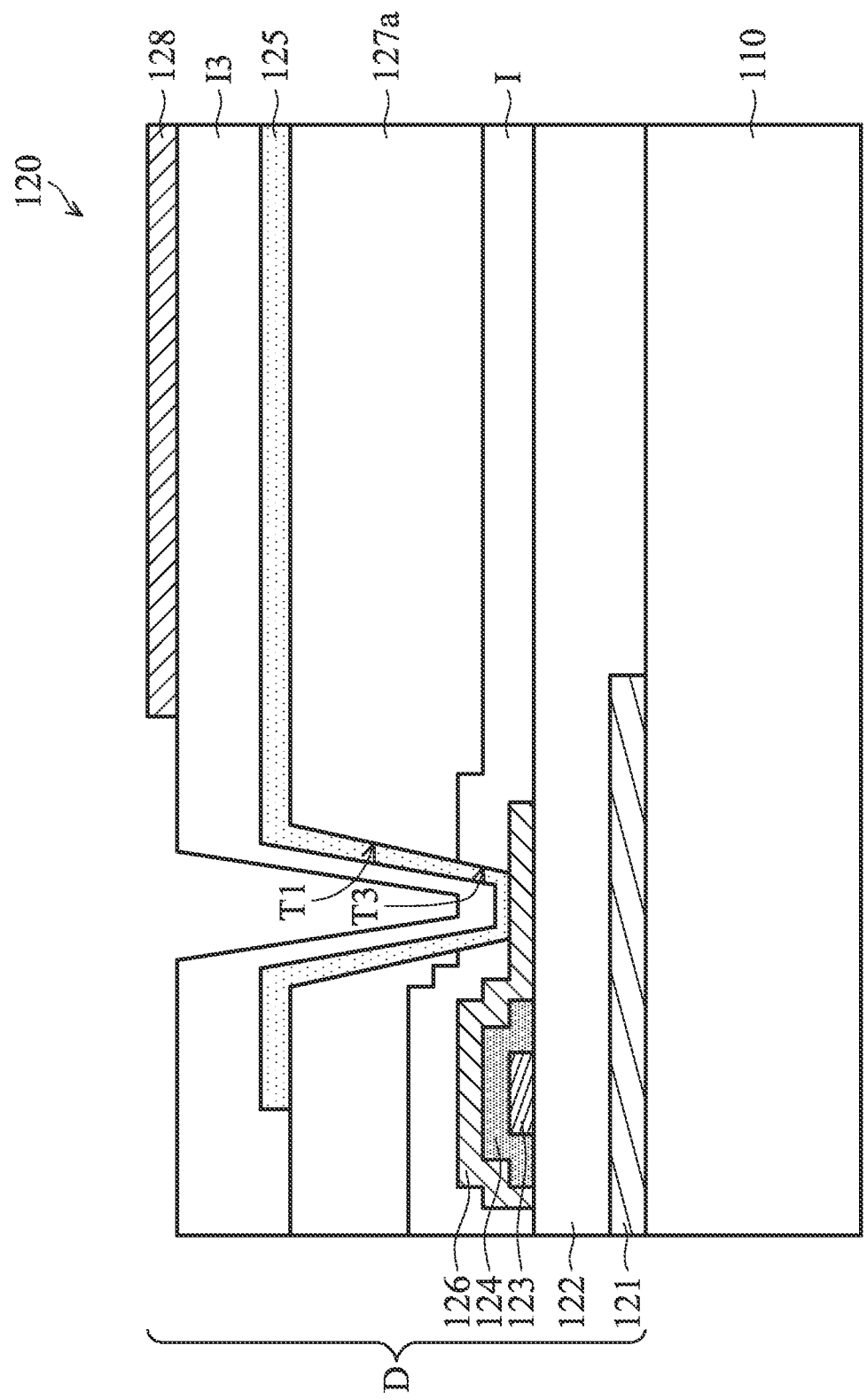
FIG. 4 is a cross-sectional view of a device layer and a first substrate of a display panel in accordance with an embodiment of the present invention.

FIG. 4 is a cross-sectional view of a device layer and a first substrate of a display panel in accordance with an embodiment of the present invention. Referring to FIG. 4, the device layer D of the present embodiment is similar to the device layer D of FIGS. 3A and 3B except that the pixel electrode 125 of the thin-film transistor 120 of the device layer D of the present embodiment is located below the common electrode 128.

Specifically, the thin-film transistor 120 of the present embodiment may further include a fourth insulating layer I3 disposed on the first insulating layer 127a. The common electrode 128 is disposed on the fourth insulating layer I3 and above the pixel electrode 125.

Compared with the thin-film transistor 120 of FIGS. 3A and 3B, the thin-film transistor 120 of the present embodiment does not have the second insulating layer 129 between the gate insulating layer 122 and the first insulating layer 127a.

Figure 5A:
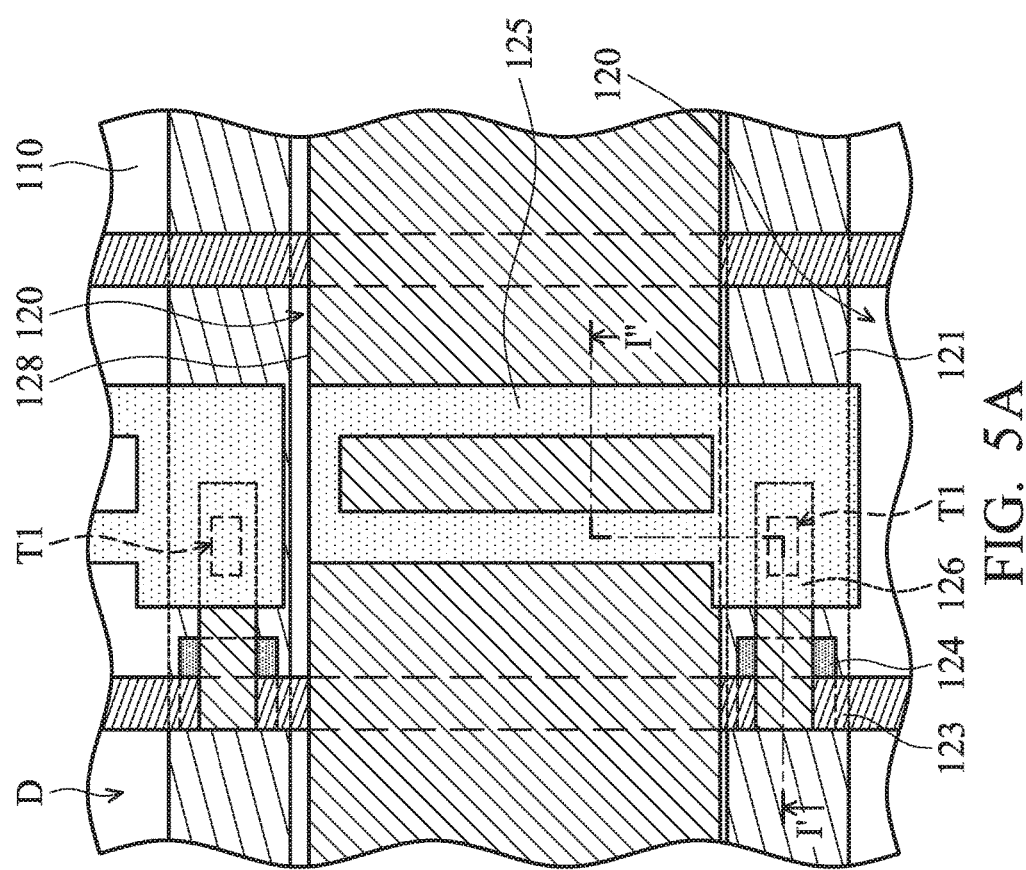
FIG. 5A is a top view of a device layer and a first substrate of a display panel in accordance with another embodiment of the present invention.
Figure 5B:
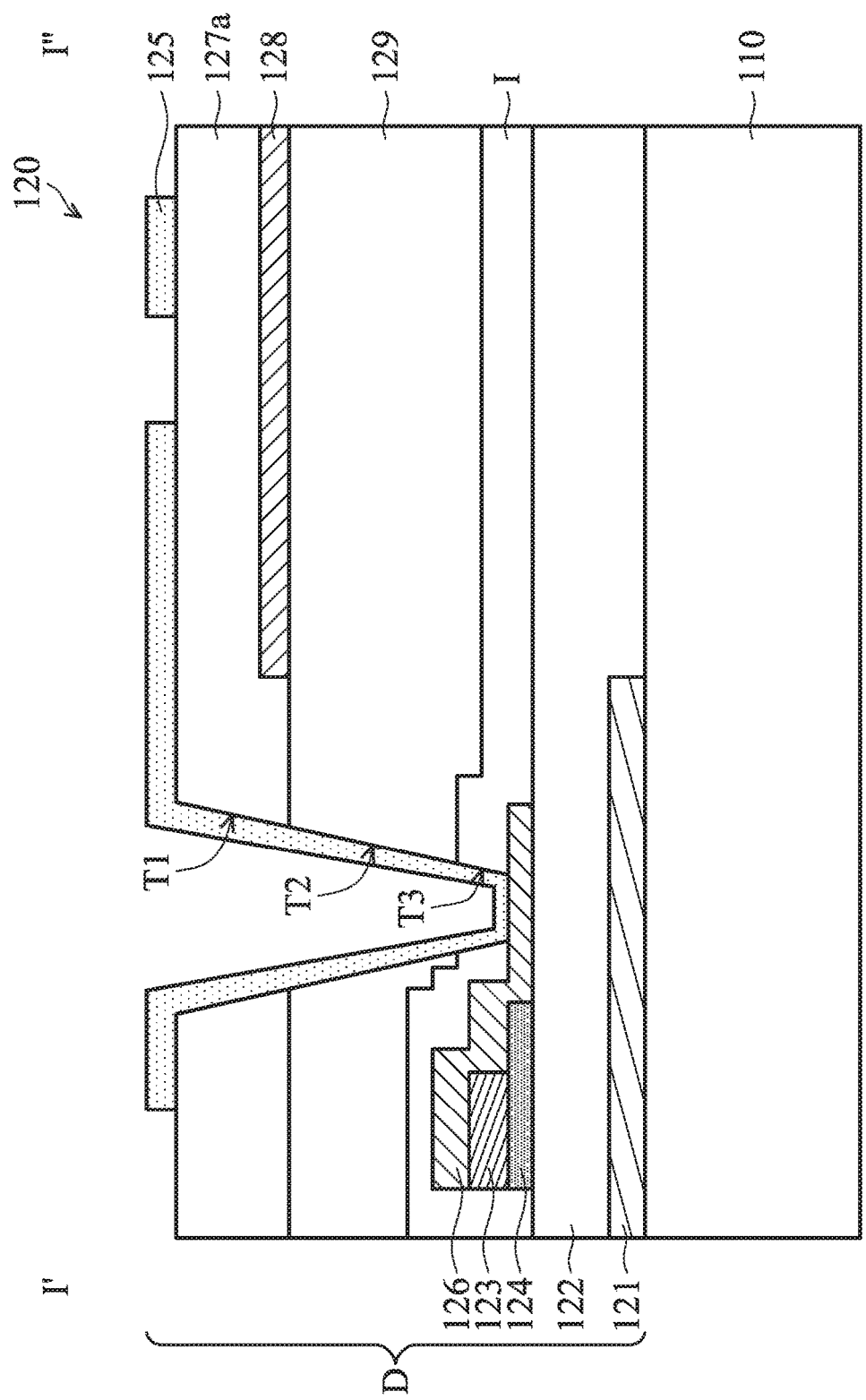
FIG. 5B is a cross-sectional view of the device layer and the first substrate taken along the line I'-I" of FIG. 5A.

FIG. 5A is a top view of a device layer and a first substrate of a display panel in accordance with another embodiment of the present invention. FIG. 5B is a cross-sectional view of the device layer and the first substrate taken along the line I'-I" of FIG. 5A.

Referring to FIGS. 5A and 5B, the device layer D of the present embodiment is similar to the device layer D of FIGS. 2A-2B and the device layer D of FIGS. 3A-3B. Specifically, the transparent conductive layer 124 of the thin-film transistor 120 of the device layer D of the present embodiment is located between the source electrode 123 and the gate insulating layer 122, such that the device layer D of the present embodiment is similar to the device layer D of FIGS. 2A-2B. The pixel electrode 125 of the thin-film transistor 120 of the device layer D of the present embodiment is located on the active layer 126, such that the device layer D of the present embodiment is similar to the device layer D of FIGS. 3A-3B. Besides, the pixel electrode 125 of the present embodiment is located above the common electrode 128, such that the device layer D of the present embodiment is similar to the device layer D of FIGS. 3A-3B.

Figure 6:
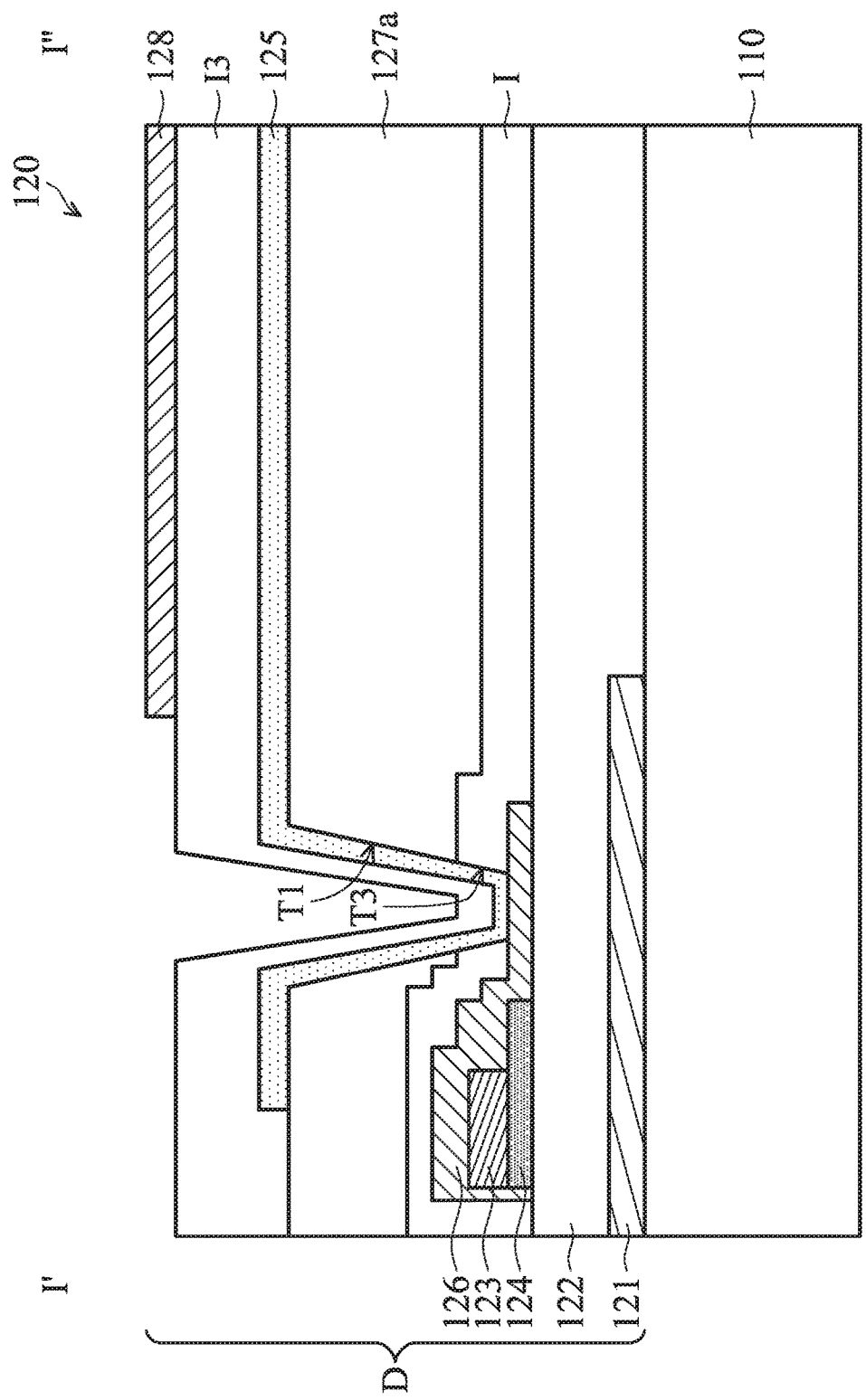
FIG. 6 is a cross-sectional view of a device layer and a first substrate of a display panel in accordance with an embodiment of the present invention.

FIG. 6 is a cross-sectional view of a device layer and a first substrate of a display panel in accordance with an embodiment of the present invention. Referring to FIG. 6, the device layer D of the present embodiment is similar to the device layer D of FIGS. 5A-5B. The difference therebetween is that the pixel electrode 125 of the thin-film transistor 120 of the device layer D of the present embodiment is located below the common electrode 128.

Specifically, the thin-film transistor 120 of the present embodiment may further include a fourth insulating layer 13 disposed on the first insulating layer 127a. The common electrode 128 is disposed on the fourth insulating layer 13 and above the pixel electrode 125.

Besides, compared with the thin-film transistor 120 of FIGS. 5A and 5B, the thin-film transistor 120 of the present embodiment does not have the second insulating layer 129 between the gate insulating layer 122 and the first insulating layer 127a.

Figure 7:
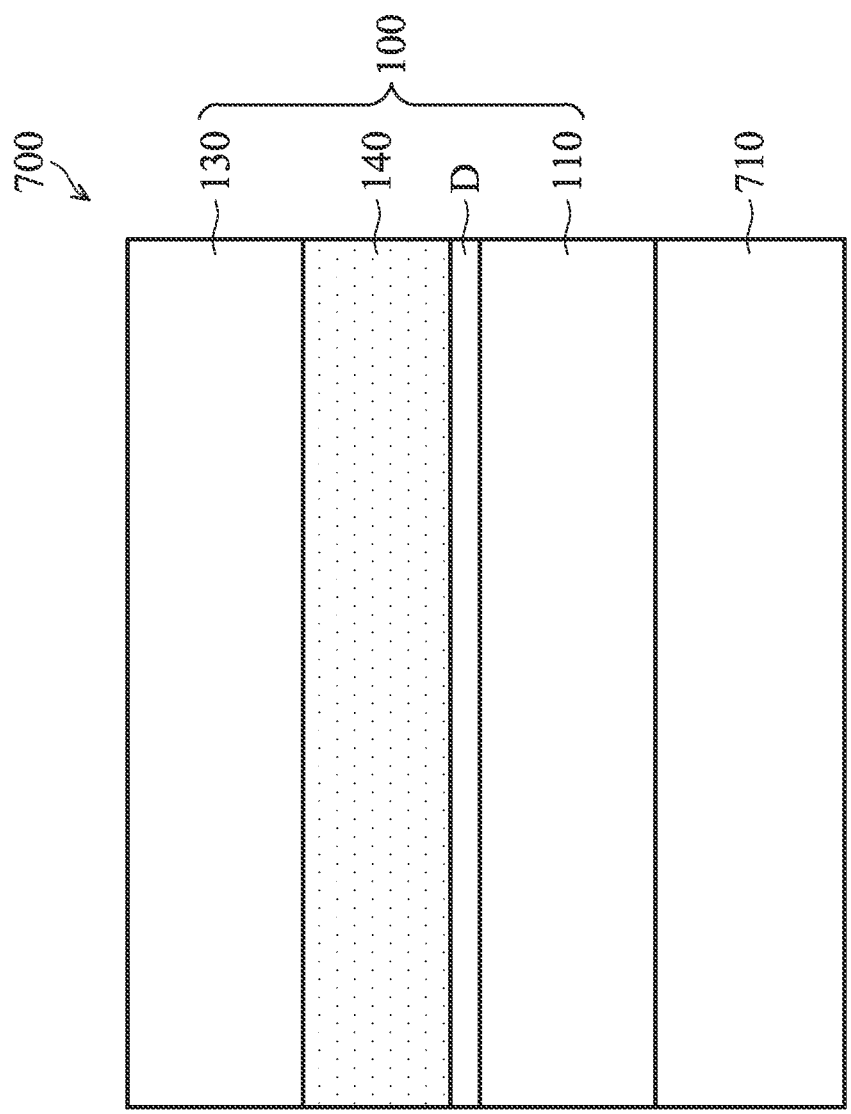
FIG. 7 is a cross-sectional view of a display apparatus in accordance with an embodiment of the present invention.

FIG. 7 is a cross-sectional view of a display apparatus in accordance with an embodiment of the present invention. Referring to FIG. 7, a display apparatus 700 of the present embodiment includes the display panel 100 of FIG. 1A and a back light module 710, wherein the display panel 100 is disposed on the back light module 710. The device layer D of the display panel 100 may be replaced with any one of the device layers D shown in FIGS. 2A-6. The display apparatus 700 may be a cell phone, a computer screen, or other suitable display apparatuses.

In view of the foregoing, the present invention forms a transparent conductive layer overlapping and electrically connecting the source electrode to reduce the channel length of the thin-film transistor. Besides, the transparent conductive layer of the present invention is in direct contact with the sidewall of the source electrode to oxidize the aluminum needles on the sidewall of the source electrode. Therefore, the present invention may solve the problem of the bad electrical connection between the source electrode and the active layer due to the aluminum needles.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display panel, comprising:
  a first substrate;
  a device layer disposed on the first substrate, wherein the device layer includes a plurality of thin-film transistors and the thin-film transistor comprises:
  a gate electrode;
  a gate insulating layer disposed on the first substrate and covering the gate electrode;
  a source electrode disposed on the gate insulating layer;
  a transparent conductive layer disposed on the gate insulating layer and overlapping and electrically connected to the source electrode;
  a pixel electrode disposed on the gate insulating layer; and
  an active layer disposed on the gate insulating layer and over the gate electrode, wherein the pixel electrode is located above the active layer, the active layer is electrically connected to the transparent conductive layer and the pixel electrode, the transparent conductive layer is disposed between the active layer and the source electrode, and the active layer is in direct contact with at least a portion of a top surface of the transparent conductive layer;
  a second substrate disposed on the first substrate, wherein the device layer is located between the first substrate and the second substrate; and
  a display medium located between the first substrate and the second substrate.

2. The display panel as claimed in claim 1, wherein the active layer covers at least a portion of the transparent conductive layer.

3. The display panel as claimed in claim 1, wherein the active layer covers at least a portion of the transparent conductive layer and at least a portion of the source electrode.

4. The display panel as claimed in claim 1, wherein a space between the transparent conductive layer and the pixel electrode is less than or equal to 3 μm and larger than or equal to 0.5 μm.

5. The display panel as claimed in claim 1, wherein the pixel electrode is in direct contact with the active layer.

6. The display panel as claimed in claim 1, wherein the display medium comprises a liquid crystal layer or an organic light-emitting layer.

7. A display apparatus, comprising:
  a display panel as claimed in claim 1; and
  a back light module, wherein the display panel is disposed on the back light module.

8. The display panel as claimed in claim 1, wherein the thin-film transistor further comprises:
  a first insulating layer disposed on the gate insulating layer and covering the source electrode, the transparent conductive layer and the active layer, the first insulating layer has a first through hole exposing the active layer, and the pixel electrode is disposed on the first insulating layer and extends into the first through hole to connect to the active layer.

9. The display panel as claimed in claim 8, wherein the thin-film transistor further comprises:
  a second insulating layer disposed between the gate insulating layer and the first insulating layer and covering the source electrode, the transparent conductive layer and the active layer, the second insulating layer has a second through hole, the second through hole is connected to the first through hole to expose the active layer, and the pixel electrode extends into the first through hole and the second through hole to connect the active layer; and
  a common electrode disposed on the second insulating layer and located between the second insulating layer and the first insulating layer, wherein the common electrode is below the pixel electrode.

10. The display panel as claimed in claim 9, wherein a width of the first through hole is greater than a width of the second through hole.

11. The display panel as claimed in claim 9, wherein the thin-film transistor further comprises:
  a third insulating layer disposed between the gate insulating layer and the second insulating layer and covering the source electrode, the transparent conductive layer and the active layer, the third insulating layer has a third through hole, the third through hole is connected to the second through hole to expose the active layer, and the pixel electrode extends into the first through hole, the second through hole, and the third through hole to connect the active layer.

12. The display panel as claimed in claim 11, wherein a width of the first through hole is greater than a width of the second through hole, and the width of the second through hole is greater than a width of the third through hole.

13. A display panel, comprising:
a first substrate;
a device layer disposed on the first substrate, wherein the device layer includes a plurality of thin-film transistors and the thin-film transistor comprises:
a gate electrode;
a gate insulating layer disposed on the first substrate and covering the gate electrode;
a source electrode disposed on the gate insulating layer;
a transparent conductive layer disposed on the gate insulating layer and overlapping and electrically connected to the source electrode;
a pixel electrode disposed on the gate insulating layer; and
an active layer disposed on the gate insulating layer and over the gate electrode, wherein the active layer is electrically connected to the transparent conductive layer and the pixel electrode, the transparent conductive layer is disposed between the active layer and the source electrode, and the active layer is in direct contact with at least a portion of a top surface of the transparent conductive layer;
a second substrate disposed on the first substrate, wherein the device layer is located between the first substrate and the second substrate; and
a display medium located between the first substrate and the second substrate, wherein the pixel electrode is in direct contact with a top surface of the active layer.

* * * * *